United States Patent [15] 3,636,385
Koepp [45] Jan. 18, 1972

[54] PROTECTION CIRCUIT

[72] Inventor: Ronald L. Koepp, Dayton, Ohio
[73] Assignee: The National Cash Register Company, Dayton, Ohio

[22] Filed: Feb. 13, 1970
[21] Appl. No.: 11,181

[52] U.S. Cl. ....307/304, 307/202, 307/237, 307/251, 307/313
[51] Int. Cl. ....H03k 17/60
[58] Field of Search ....307/202, 237, 246, 251, 255, 307/279, 304, 313; 317/33 R, 235 B

[56] References Cited

UNITED STATES PATENTS

| | | | |
|---|---|---|---|
| 2,825,822 | 3/1958 | Huang | 307/279 X |
| 2,971,102 | 2/1961 | Schultz | 307/202 X |
| 3,286,189 | 11/1966 | Mitchell et al. | 307/237 X |
| 3,395,290 | 7/1968 | Farina et al. | 307/251 X |
| 3,403,270 | 9/1968 | Pace et al. | 317/235 B |
| 3,407,339 | 10/1968 | Booher | 317/33 |
| 3,454,891 | 7/1969 | Siegel | 317/235 B |
| 3,470,390 | 9/1969 | Lin | 307/304 X |
| 3,512,058 | 5/1970 | Khajezadeh et al. | 307/304 X |

*Primary Examiner*—Stanley T. Krawczewicz
*Attorney*—Louis A. Kline, John J. Callahan and Harry W. Barron

[57] ABSTRACT

A protection circuit is disclosed for protecting a P-channel enhancement-type metal oxide semiconductor transistor from rupturing due to static voltage building up between its gate and source electrodes. The protection circuit includes at least one N-channel depletion-type transistor having its drain and source electrodes connected between the gate and source electrodes of the enhancement-type transistor and its gate electrode coupled to a negative power supply terminal. A resistor is also included between the gate of the enhancement-type transistor and the terminal to which an input signal is applied. There is also included a diode, in shunt with the resistor and the depletion-type transistor, which is poled to be reverse biased by the input signal.

7 Claims, 3 Drawing Figures

INVENTOR
RONALD L. KOEPP
BY
Louis A. Kline
John J. Callahan
Harry W Barron
HIS ATTORNEYS

PROTECTION CIRCUIT

This invention relates to a protection circuit and, more particularly, to a protection circuit for field effect transistors which protects these transistors from rupturing due to the buildup of static electricity prior to the time the circuit is rendered operative.

With the advent of integrated circuit technology, it has become possible to provide integrated circuits which include hundreds of active field effect transistor elements e.g., metal oxide semiconductor, or MOS-types) on a single integrated circuit chip. These chips are provided by the manufacturer in packages which in order to be made operative merely have to be plugged in to a voltage source and have a signal applied thereto. One major problem with these circuits is that, prior to the time they are made operative, static electricity builds up between the input electrode and the reference electrode of the chip due to the extremely high input impedance of a field effect transistor. If this voltage becomes large enough e.g., 70 to 100 volts), it can cause the transistor elements on the chip to be ruptured; that is, cause the gate and source or gate and drain electrodes to become short-circuited. This in turn results in catastrophic failure or other inoperability of the transistors.

Several circuit arrangements are suggested by the prior art for protecting the transistors on an integrated circuit chip. Each of these arrangements utilizes a diode, or an element which acts similarly to a diode, connected between the terminals of the chip between which static voltage builds up and causes the problem. These prior art circuits operate in such a manner that, if the polarity of the static voltage is in a direction to forward bias the diode, it conducts essentially immediately to short the two terminals, thereby reducing the input impedance and thus preventing the static voltage from building up.

However, when the static voltage builds up in a direction which tends to reverse bias the diode, the diode is not rendered conductive until the static voltage is large enough to cause the diode to break down; that is, go into its zener or avalanche region. When this occurs, the diode clamps the static voltage at the diode breakdown voltage value, which must be below the rupture voltage of the protected transistor; however, this voltage will still be a relatively large value e.g., in the order of 50 volts). In order to protect the circuit from the voltages near the breakdown voltage when the chip is rendered operable, it is necessary to include a relatively large resistor e.g., in the order of 2,000 to 4,000 l ohms) in the circuit connecting the signal input terminal to the gate of the protected transistor. This resistor, together with the gate capacitance of the protected transistor, develops an RC delay network which allows the protecting diode time to dissipate the potential damaging charge by its avalanche mechanism.

The inclusion of these relatively large resistors in the input circuit has an adverse effect on the speed of operation of the protected transistor, especially if it is used for switching purposes as a part of a digital circuit. The reason is that a field effect transistor has a capacitive input inherently associated with it, and the transistor cannot be turned on until the capacitance has been charged up to its threshold, or turn-on, voltage. The charge-up time of the capacitance, in turn, is a function of the resistance of the line coupling it to the signal; that is, $t$ is proportional to RC, where $t$ is time, "R" is resistance, and "C" is capacitance. The only substantial resistance is the resistor discussed above, and, the larger it is made, the slower the circuit operates.

It is an object of this invention to provide an improved protection circuit.

In accordance with one embodiment of this invention, there is provided a protection circuit which comprises at least one semiconductor device which is operative only when a bias voltage is applied thereto. The protection circuit also includes a second type of semiconductor device, which is conductive only when the bias voltage is not applied thereto and which is nonconductive only when the bias voltage is applied thereto. This second semiconductor is coupled to the first semiconductor so that it shunts any static voltage applied to the first semiconductor prior to the time that the bias voltage is applied to the first and second semiconductors.

A detailed description of one embodiment of this invention is given hereinafter, where reference is made to the following FIGURES, in which.

Figure 1:
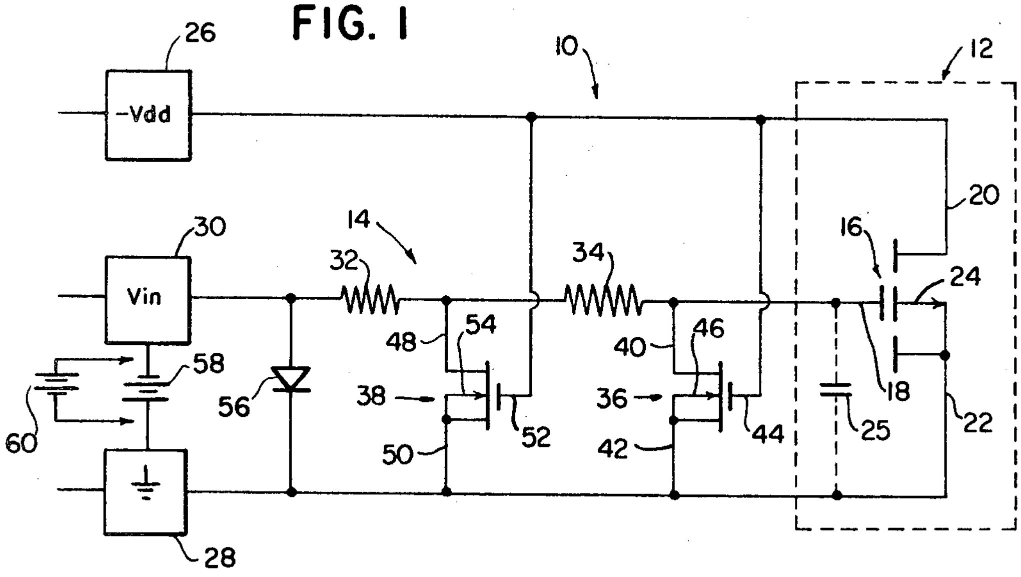
FIG. 1 shows a circuit diagram of one embodiment of this invention.

Referring now to FIG. 1, there is shown a circuit 10, which includes a transistor array 12 and a protection circuit 14. The transistor array 12 is shown as including a single P-channel enhancement-type metal oxide semiconductor (MOS) transistor 16, which includes a gate electrode 18, a drain electrode 20, and a source electrode 22. There is also a substrate 24, which is connected directly to the source electrode 22. Although only a single transistor is shown as the part of the transistor array 12, in practice many such transistors may be included in this portion of the circuit.

As used herein, the term "enhancement-type transistor" is defined as being a field effect transistor in which a conductive channel between the source and drain electrodes is created (or enhanced) by the application of a voltage to the gate electrode. The term "depletion-type transistor" is defined as being a field effect transistor in which a channel exists between the source and drain electrodes when no voltage is applied to the gate electrode and in which this channel may be made either more conductive (enhanced) or less conductive (depleted) by the application of a voltage of one or another polarity to the gate electrode.

As is well known in the art, an MOS transistor has, associated therewith, an internal capacitor, due to its unique construction. This internal capacitance is represented by a capacitor 25, which is shown in dashed lines because it is inherent in the structure of the transistor 16 and is not a component of the circuit 10. The transistor 16 cannot be made conductive until proper bias is applied to its drain and source electrodes 20 and 22 and, further, until the capacitor 25 has been charged.

The drain electrode 20 of the transistor 16 is coupled to a terminal 26 on the integrated circuit chip, and the source electrode 22 of the transistor 16 is coupled to another terminal 28. When one desires to use the circuit 10, it is necessary to connect a voltage between the terminals 26 and 28, with the terminal 28 being at ground potential and the terminal 26 being at some negative voltage potential, such as 35 volts. Thereafter, it is only necessary to apply a negative voltage input signal to the gate 18 of the transistor 16, and the desired operation will be performed. This input signal is applied to the circuit 10 at the terminal 30 and, through resistors 32 and 34, to the gate 18. The values of the resistors 32 and 34 will determine how fast the capacitor 25 becomes charged and thus how fast the transistor 16 responds to the input signal.

The resistors 32 and 34 are a part of the protection circuit 14. The protection circuit 14 further includes a pair of N-channel depletion-type transistors 36 and 38. The transistor 36 includes a drain electrode 40, a source electrode 42, and a gate electrode 44, as well as a substrate 46, which is connected to the source electrode 42. The transistor 38 includes a drain electrode 48, a source electrode 50, a gate electrode 52, and a substrate 54, which is connected to the source electrode 50. The drain electrode 40 of the transistor 36 is connected between the junction of the resistor 34 and the gate electrode 18 of the transistor 16, and the source electrode 42 of the transistor 36 is connected to the terminal 28. The gate electrode 44 of the transistor 36 is connected to the terminal 26. The drain electrode of the transistor 38 is connected to the junction of the resistors 32 and 34, and the source electrode 50 of the transistor 38 is connected to the terminal 28. The gate electrode 52 of the transistor 38 is connected to the terminal 26. A diode 56 is connected with an anode connected to the terminal 30 and the cathode connected to the terminal 28.

Figures 2A, 2B:
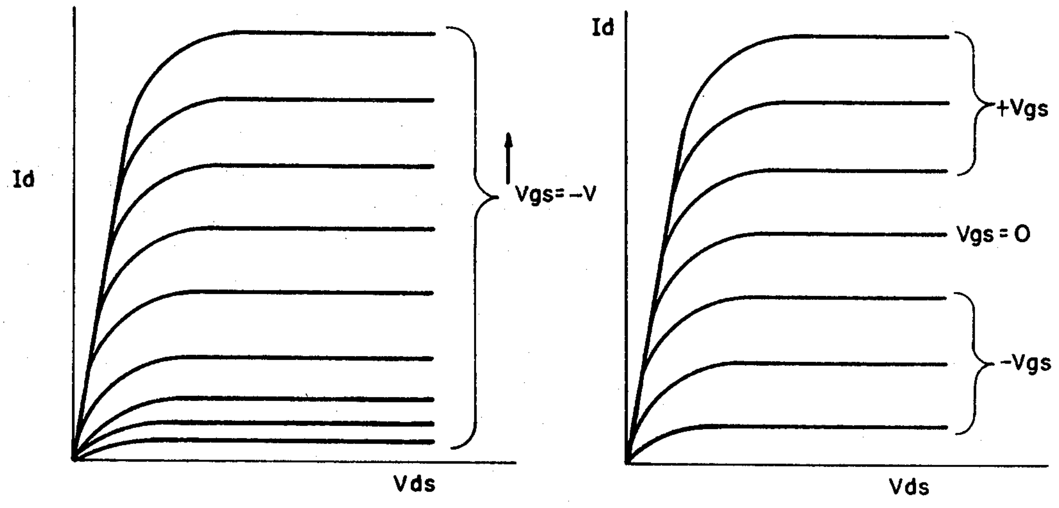
FIGS. 2A and 2B show the operating characteristics of the two types of transistors used in the circuit shown in FIG. 1.

Referring to FIG. 2A, there is shown the drain current $I_d$ versus the drain to source voltage $V_{ds}$ for various gate to source voltages $V_{gs}$ of a P-channel enhancement-type transistor such as the transistor 16. FIG. 2B shows the drain current $I_d$ versus drain to source voltage $V_{ds}$ for various gate to source voltages $V_{gs}$ of an N-channel depletion-type transistor such as the transistors 36 and 38. From FIG. 2A it is seen that, when the terminals 26 and 28 are disconnected from the voltage source, the drain current flowing through the transistor 16 is zero, and the transistor 16 will be cut off. From FIG. 2B, it is seen that, where the gate to source voltage of the transistor 36 or the transistor 38 is zero, they may be made conductive merely by applying a voltage between the drain and source electrodes. Further, it is seen in FIG. 2B that, once the negative voltage is coupled between the terminals 26 and 28—that is, between the gate and the source of the transistors 36 and 38—they will be rendered nonconductive, assuming, of course, that the voltage supply to the terminals 26 and 28 is below the "pinch-off" voltage of these transistors. The term "-pinch-off" voltage is defined as being a voltage of magnitude sufficient to render the depletion-type transistors to which it is applied essentially nonconductive.

The operation of the circuit 10 will be described hereinafter. It will first be assumed that a static voltage will be building up, with a positive value at the terminal 28 and a negative value at the terminal 30. This static voltage is represented by a battery 58, which is not a component to be included in the circuit but is only inherent due to the static voltage buildup. As previously explained, the transistors 36 and 38 are conductive prior to the time a negative voltage is applied between the terminals 26 and 28 if a voltage, such as static voltage 58, is applied between their drain and source electrodes. In this case, the terminals 28 and 30 will be coupled together by a low-resistance DC path which includes the resistors 32 and 34. Thus the static voltage 58 will never be able to build up above a negligible value. This is much more desirable than the prior art system where the static voltage could build up to the breakdown value of the prior art diode. Due to the very small static voltage which can be built up in the circuit 10, there is no need for large resistors in the input circuit, and thus the resistors 32 and 34 may be much smaller. In the circuit 10, typical values for the resistors 32 and 34 may be in the order of 100 to 200 ohms, whereas, in the prior art, typical values for these resistors may have been as high as 2,000 or more ohms. Since the resistors 32 and 34 are so much smaller in value than were the prior art resistors, the RC charge-up time of the capacitor 25 will be much less, and thus a greater operating speed may be obtained from the elements included in the transistor array 12.

If the static voltage buildup is in the opposite direction to the voltage 58—that is, with a positive value at the terminal 30 and a negative or ground value at the terminal 28, as represented by the battery 60—the diode 56 will conduct after the voltage 60 reaches a value of approximately 0.65 volt, and again the terminals 28 and 30 will be connected together by a low-resistance DC path. Again, since the diode 56 will be conductive as soon as a small amount of static voltage appears, the values of the resistors 32 and 34 will not have to be as large as they were in the prior art. When an input signal is applied to the terminal 30, it will be a negative voltage with respect to the terminal 28, so the diode 56 will be reverse-biased and thus appear as an open circuit.

Thus, when no voltage is applied between the terminals 26 and 28, there will be a low impedance between the terminals 28 and 30, and therefore negligible static voltage will build up. After the circuit 10 is made operable by application of a voltage between the terminals 26 and 28 and a negative input signal voltage is applied to the terminal 30, the diode 56 will be reverse biased, and the transistors 36 and 38 will be cut off; thus they will not affect the circuit. Further, since the resistance coupling the terminal 30 to the gate 18 of the transistor 16 will be much smaller than the prior art protection circuit, there will be an increase in operating speed.

It should be noted that P-channel enhancement-type transistors and N-channel depletion-type transistors were used in the circuit 10. However, identical operations, with the exception that all voltage and current polarities are reversed, would be achieved if one used N-channel enhancement-type transistors and P-channel depletion-type transistors. Further, although MOS-type transistors were discussed with respect to the circuit 10, any type of field effect transistor having characteristics similar to those discussed above may be used.

It should also be noted that, since the gate electrodes 44 and 52 of the transistors 36 and 38 are coupled directly to the terminal 26, and since the bias voltage applied to the terminal 26 will be in the order of −35 volts, the transistors 36 and 38 may be designed to have a "pinch-off" voltage as high as −32 or −33 volts, and thus the oxide layers can have a thickness of 10,000 Angstroms to 12,000 Angstroms. Thus, the rupture voltage of these devices will be several thousand volts, so no protection is needed for them. This should be contrasted with the situation with respect to the transistor 16, where a response to small voltage is desired, and thus the oxide layer must be in the order of 1,000 Angstroms to 1,200 Angstroms. Therefore the rupture voltage will be low, and the transistor 16 will require the protection afforded by the protection circuit 14.

What is claimed is:

1. In combination:

at least one enhancement-type metal oxide semiconductor transistor of one conductivity type which is connectable to a source of bias voltage and which is operative only when said bias voltage is applied thereto; and at least one depletion-type metal oxide semiconductor transistor of opposite conductivity type which is connectable to a source of bias voltage, which is conductive only when said bias voltage is not applied thereto, and which is nonconductive only when said bias voltage is applied thereto;

said depletion-type transistor being coupled to said enhancement-type transistor so that said depletion-type transistor shunts any static voltage applied to said enhancement-type transistor prior to the application of said bias voltage to said enhancement-type and depletion-type transistors.

2. The invention according to claim 1 wherein said transistors each have a drain electrode, a gate electrode, and a source electrode;

wherein the source and drain electrodes of said depletion-type transistor are connected between the gate electrode and one of the source and drain electrodes of said enhancement-type transistor; and wherein said gate electrode of said depletion-type transistor and the other one of said source and drain electrodes of said enhancement-type transistor are connected to a terminal which is connectable to said source of bias voltage.

3. The invention according to claim 2 wherein said one of said source and drain electrodes of said enhancement-type transistor are connected to a second terminal which is connectable to a point of reference potential;

wherein said protection circuit further includes a third terminal connectable to an input signal; and means, including a resistance, for coupling said third terminal to the junction of said depletion-type transistor and the gate electrode of said enhancement-type transistor; and wherein said static voltage is applied to said enhancement-type transistor, in the absence of said depletion-type transistor, by being built up between said second and third terminals.

4. On an integrated circuit chip which includes first, second, and third terminals respectively connectable to a source of bias voltage, a source of data voltage, and a point of reference voltage, and which further includes at least one enhancement-type field effect transistor of one conductivity type having a source electrode, a drain electrode, and a gate electrode, there being means for coupling said source and drain electrodes between said first and third terminals, said enhancement-type transistor being operable only when said source of bias voltage and point of reference voltage are connected to said first and third terminals respectively, said enhancement-type transistor being susceptible of being rendered permanently inoperative due to static voltage which can build up between said second and third terminals, a static voltage protection circuit for said enhancement-type transistor comprising:

at least one depletion-type field effect transistor of opposite conductivity type having a source electrode, a drain electrode, and a gate electrode;

means for coupling said source and drain electrodes of said depletion-type transistor between said gate electrode of said enhancement-type transistor and the one of said source and drain electrodes of said enhancement-type transistor which is coupled to said third terminal;

means including a resistor for coupling said second terminal to the junction of said depletion-type transistor and the gate of said enhancement-type transistor; and means for coupling the gate electrode of said depletion-type transistor to said first terminal.

5. The invention according to claim 4 wherein said transistors are metal oxide semiconductor transistors and wherein said one type conductivity is P-channel and said opposite type conductivity is N-channel.

6. The invention according to claim 4 wherein said protection circuit further includes:

a second depletion-type field effect transistor of said opposite conductivity having a source, a drain, and a gate electrode, means for coupling said source and drain electrodes of said second depletion-type transistor between the end of said resistor remote from the gate electrode of said enhancement-type transistor and said one of said source and drain electrodes of said enhancement-type transistor, and means for coupling said gate electrode of said second depletion-type transistor to said first terminal; and wherein said means for coupling said second terminal to said junction includes a second resistor coupled between said remote end of said first resistor and said second terminal.

7. The invention according to claim 6 wherein said protection circuit further includes a diode coupled between said second and third terminals, said diode being poled to be reverse-biased by the application of said source of data voltage to said second terminal.

* * * * *